US010446212B2

(12) United States Patent
Hashimoto et al.

(10) Patent No.: US 10,446,212 B2
(45) Date of Patent: Oct. 15, 2019

(54) MAGNETIC MEMORY DEVICE

(71) Applicant: TOSHIBA MEMORY CORPORATION, Tokyo (JP)

(72) Inventors: Susumu Hashimoto, Nerima Tokyo (JP); Yasuaki Ootera, Yokohama Kanagawa (JP); Tsuyoshi Kondo, Kawasaki Kanagawa (JP); Takuya Shimada, Kawasaki Kanagawa (JP); Michael Arnaud Quinsat, Yokohama Kanagawa (JP); Masaki Kado, Kamakura Kanagawa (JP); Nobuyuki Umetsu, Kawasaki Kanagawa (JP); Shiho Nakamura, Fujisawa Kanagawa (JP); Tomoya Sanuki, Suzuka Mie (JP); Yoshihiro Ueda, Yokohama Kanagawa (JP); Shinji Miyano, Yokohama Kanagawa (JP); Hideaki Aochi, Yokkaichi Mie (JP); Yasuhito Yoshimizu, Yokkaichi Mie (JP); Yuichi Ito, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/918,090

(22) Filed: Mar. 12, 2018

(65) Prior Publication Data
US 2019/0088304 A1 Mar. 21, 2019

(30) Foreign Application Priority Data
Sep. 15, 2017 (JP) ................................. 2017-178358

(51) Int. Cl.
*G11C 11/16* (2006.01)
*H01L 27/22* (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC .............. G11C 11/161; G11C 11/1659; G11C 11/1673; G11C 11/1675
See application file for complete search history.

(56) References Cited

U.S. PATENT DOCUMENTS

| 2011/0085258 A1* | 4/2011 | Bae ........................ B82Y 25/00 360/31 |
| 2011/0157967 A1* | 6/2011 | Suzuki .................... G11C 11/15 365/158 |

(Continued)

FOREIGN PATENT DOCUMENTS

| JP | 2016-9806 A | 1/2016 |
| JP | 6093146 B2 | 2/2017 |

*Primary Examiner* — Hoai V Ho
*Assistant Examiner* — Jay W. Radke
(74) *Attorney, Agent, or Firm* — Finnegan, Henderson, Farabow, Garrett & Dunner, L.L.P.

(57) ABSTRACT

According to one embodiment, a magnetic memory device includes a first magnetic portion, a first electrode, a second electrode, a third electrode, a second magnetic portion, a first nonmagnetic portion, and a controller. The first magnetic portion includes an extension portion and a third portion. The extension portion includes a first portion and a second portion. The third portion is connected to the second portion. The first electrode is electrically connected to the first portion. At least a portion of the third portion is positioned between the second electrode and the third electrode. The second magnetic portion is provided between the second electrode and the at least a portion of the third portion. The first nonmagnetic portion is provided between the second magnetic portion and the at least a portion of the third
(Continued)

portion. The controller is electrically connected to the first, second electrode, and third electrodes.

20 Claims, 11 Drawing Sheets

(51) Int. Cl.
*H01L 43/08* (2006.01)
*H01L 43/02* (2006.01)
*H01F 10/32* (2006.01)
*H01L 43/10* (2006.01)

(52) U.S. Cl.
CPC ............ *H01L 27/228* (2013.01); *H01L 43/02* (2013.01); *H01L 43/08* (2013.01); *H01F 10/329* (2013.01); *H01F 10/3254* (2013.01); *H01F 10/3286* (2013.01); *H01L 43/10* (2013.01)

(56) References Cited

U.S. PATENT DOCUMENTS

| | | | |
|---|---|---|---|
| 2013/0250668 A1* | 9/2013 | Fukuzawa | G11C 11/161 365/158 |
| 2014/0119111 A1 | 5/2014 | Nakamura et al. | |
| 2015/0380638 A1 | 12/2015 | Ootera et al. | |
| 2016/0155778 A1* | 6/2016 | Shimada | H01L 27/228 257/252 |
| 2017/0077174 A1* | 3/2017 | Kondo | H01L 43/12 |

* cited by examiner

MAGNETIC MEMORY DEVICE

CROSS-REFERENCE TO RELATED APPLICATIONS

This application is based upon and claims the benefit of priority from Japanese Patent Application No. 2017-178358, filed on Sep. 15, 2017; the entire contents of which are incorporated herein by reference.

FIELD

Embodiments described herein relate generally to a magnetic memory device.

BACKGROUND

A magnetic memory device has been proposed in which information recorded in a magnetic wire is moved by moving domain walls. It is desirable to increase the storage density of the magnetic memory device.

DETAILED DESCRIPTION

Figures 1A, 1B:
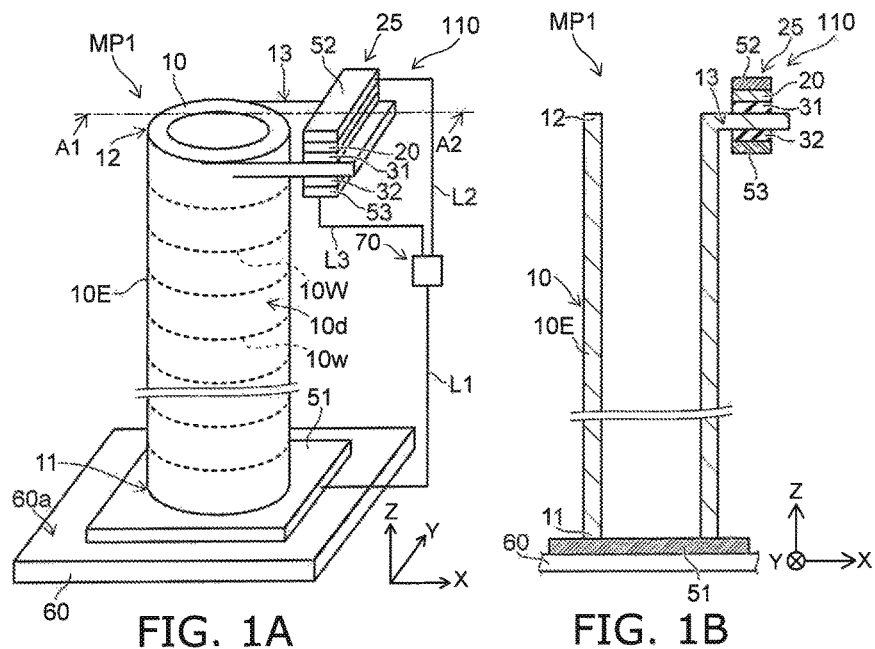
FIG. 1A and FIG. 1B are schematic views illustrating a magnetic memory device according to a first embodiment.

According to one embodiment, a magnetic memory device includes a first magnetic portion, a first electrode, a second electrode, a third electrode, a second magnetic portion, a first nonmagnetic portion, and a controller. The first magnetic portion includes an extension portion and a third portion. The extension portion includes a first portion and a second portion. The third portion is connected to the second portion. A direction from the first portion toward the second portion is aligned with a first direction. The first electrode is electrically connected to the first portion. At least a portion of the third portion is positioned between the second electrode and the third electrode. The second magnetic portion is provided between the second electrode and the at least a portion of the third portion. The first nonmagnetic portion is provided between the second magnetic portion and the at least a portion of the third portion. The controller is electrically connected to the first electrode, the second electrode, and the third electrode. In a first operation of writing information to the third portion, the controller sets the first electrode to a first potential, sets the second electrode to a second potential, and sets the third electrode to a third potential. In a second operation of shifting magnetic domains of the extension portion, the controller sets the first electrode to the first potential, sets the second electrode to a fourth potential, and sets the third electrode to a fifth potential. An absolute value of a difference between the second potential and the first potential is less than an absolute value of a difference between the fourth potential and the first potential. An absolute value of a difference between the third potential and the first potential is greater than an absolute value of a difference between the fifth potential and the first potential.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A and FIG. 1B are schematic views illustrating a magnetic memory device according to a first embodiment.

FIG. 1A is a perspective view. FIG. 1B is a line A1-A2 cross-sectional view of FIG. 1A.

As shown in FIG. 1A and FIG. 1B, the magnetic memory device 110 according to the embodiment includes a first magnetic portion 10, a second magnetic portion 20, a first electrode 51, a second electrode 52, a third electrode 53, a first nonmagnetic portion 31, and a controller 70. A second nonmagnetic portion 32 is further provided in the example. The first magnetic portion 10, the second magnetic portion 20, the second electrode 52, the third electrode 53, the first nonmagnetic portion 31, and the second nonmagnetic portion 32 are included in, for example, one memory portion (a first memory portion MP1).

The first magnetic portion 10 includes an extension portion 10E. The extension portion 10E includes a first portion 11 and a second portion 12. The direction from the first portion 11 toward the second portion 12 is aligned with a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The first magnetic portion 10 further includes a third portion 13. The third portion 13 is connected to the second portion 12.

A substrate 60 is provided in the example. The substrate 60 spreads along the X-Y plane. A surface 60a (e.g., the upper surface) of the substrate 60 spreads along the X-Y plane.

For example, the extension portion 10E of the first magnetic portion 10 is perpendicular to the surface 60a of the substrate 60. In one example, the extension portion 10E has a pipe (annular) configuration extending in the first direction (the Z-axis direction).

In the example, the first portion 11 is positioned between the second portion 12 and the substrate 60. In the embodiment, the second portion 12 may be positioned between the first portion 11 and the substrate 60.

In the example, a second direction from at least a portion of the third portion 13 toward the second portion 12 crosses the first direction (the Z-axis direction). In the example, the second direction is, for example, the X-axis direction.

The first electrode 51 is electrically connected to the first portion 11. For example, the first electrode 51 is positioned between the extension portion 10E and the substrate 60.

At least a portion of the third portion 13 is positioned between the second electrode 52 and the third electrode 53.

In the example, the direction from the third electrode 53 toward the second electrode 52 is aligned with the first direction (the Z-axis direction). In the example, the third electrode 53 is positioned between the second electrode 52 and the substrate 60. For example, the third electrode 53 overlaps the extension portion 10E in the second direction (e.g., the X-axis direction).

The second magnetic portion 20 is provided between the second electrode 52 and the at least a portion of the third portion 13 recited above.

The first nonmagnetic portion 31 is provided between the second magnetic portion 20 and the at least a portion of the third portion 13 recited above. The first nonmagnetic portion 31 is, for example, insulative. The first nonmagnetic portion 31 includes, for example, MgO. The first nonmagnetic portion 31 may be conductive. Examples of the first nonmagnetic portion 31 are described below.

The second nonmagnetic portion 32 is provided between the third electrode 53 and the at least a portion of the third portion 13 recited above. The second nonmagnetic portion 32 is insulative. The second nonmagnetic portion 32 includes, for example, aluminum oxide, etc. Examples of the material of the second nonmagnetic portion 32 are described below.

The controller 70 is electrically connected to the first electrode 51, the second electrode 52, and the third electrode 53.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch element such as a transistor or the like) is inserted between multiple conductive bodies, and a state is formable in which a current flows between the multiple conductive bodies.

In the magnetic memory device 110, the extension portion 10E functions as a memory portion. For example, the extension portion 10E is configured to retain multiple domain walls 10w. The multiple domain walls 10w can be moved (shifted) along the first direction (the Z-axis direction). The magnetic memory device 110 is, for example, a domain wall memory device.

For example, the region between two domain walls 10w is a magnetic domain 10d. The magnetization of the magnetic domain 10d corresponds to the stored information.

For example, the multiple domain walls 10w and magnetic domains 10d are shifted by a current flowing between the second electrode 52 and the first electrode 51.

For example, a MTJ (Magnetic Tunnel Junction) element is formed of, for example, the second magnetic portion 20, the first nonmagnetic portion 31, and the third portion 13. A GMR (giant magnetic resistance) element may be formed. The second magnetic portion 20, the first nonmagnetic portion 31, and the third portion 13 are used as at least a portion of a functional portion 25. The functional portion 25 functions as, for example, a write/read element.

For example, the magnetization of the third portion 13 is controlled by a current flowing between the second magnetic portion 20 and the third portion 13. Thereby, the writing of the information is performed. For example, the reading of the information is performed by sensing the change of the electrical resistance between the second magnetic portion 20 and the third portion 13 (between the second magnetic portion 20 and the first magnetic portion 10).

A magnetic property (e.g., the magnetic anisotropy or the like) of the third portion 13 can be controlled by the potential of the third electrode 53. The third electrode 53 functions as, for example, a control electrode of the writing of the information to the third portion 13.

In one operation, the functional portion 25 performs a write operation by the voltage applied to the third electrode 53. In another one operation, the shift operation recited above is performed via the functional portion 25 by the voltage applied to the third electrode 53. A read operation also is performed via the functional portion 25.

The second electrode 52 functions as an electrode for the shift operation and functions also as an electrode for the write operation and the read operation. The third electrode 53 functions as a control electrode of these operations.

In the embodiment, the electrode for the shift operation also may be used as the electrode of another operation. Thereby, the number of interconnects can be reduced. By reducing the number of interconnects, the density of the memory portions can be increased. According to the embodiment, the storage density can be increased.

Multiple memory portions may be provided in the magnetic memory device 110.

Figures 2A, 2B, 2C:
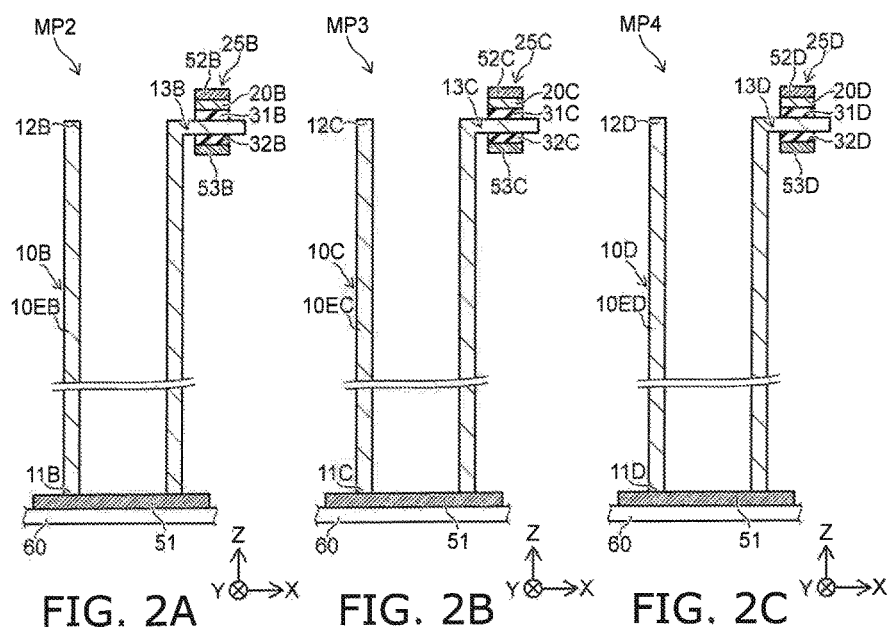
FIG. 2A to FIG. 2C are schematic cross-sectional views illustrating the magnetic memory device according to the first embodiment.

FIG. 2A to FIG. 2C are schematic cross-sectional views illustrating the magnetic memory device according to the first embodiment.

As shown in these drawings, the magnetic memory device 110 includes multiple memory portions. The multiple memory portions include, for example, the first memory portion MP1 (referring to FIG. 1B), a second memory portion MP2 (referring to FIG. 2A), a third memory portion MP3 (referring to FIG. 2B), a fourth memory portion MP4 (referring to FIG. 2C), etc. The configuration of each of the multiple memory portions is similar to the configuration of the first memory portion MP1.

As shown in FIG. 2A, the second memory portion MP2 includes a magnetic portion 10B, a magnetic portion 20B, an electrode 52B, an electrode 53B, a nonmagnetic portion 31B, and a nonmagnetic portion 32B. The magnetic portion 10B includes an extension portion 10EB. The extension portion 10EB includes portions 11B, 12B, and 13B.

As shown in FIG. 2B, the third memory portion MP3 includes a magnetic portion 10C, a magnetic portion 20C, an electrode 52C, an electrode 53C, a nonmagnetic portion 31C, and a nonmagnetic portion 32C. The magnetic portion 10C includes an extension portion 10EC. The extension portion 10EC includes portions 11C, 12C, and 13C.

As shown in FIG. 2C, the fourth memory portion MP4 includes a magnetic portion 10D, a magnetic portion 20D, an electrode 52D, an electrode 53D, a nonmagnetic portion 31D, and a nonmagnetic portion 32D. The magnetic portion 10D includes an extension portion 10ED. The extension portion 10ED includes portions 11D, 12D, and 13D.

Functional portions 25B, 25C, and 25D are provided respectively in the second to fourth memory portions MP2 to MP4. These portions respectively have configurations similar to the portions of the first memory portion MP1.

Examples of operations of the magnetic memory device 110 will now be described with reference to FIG. 3 and FIG. 4.

Figure 3:
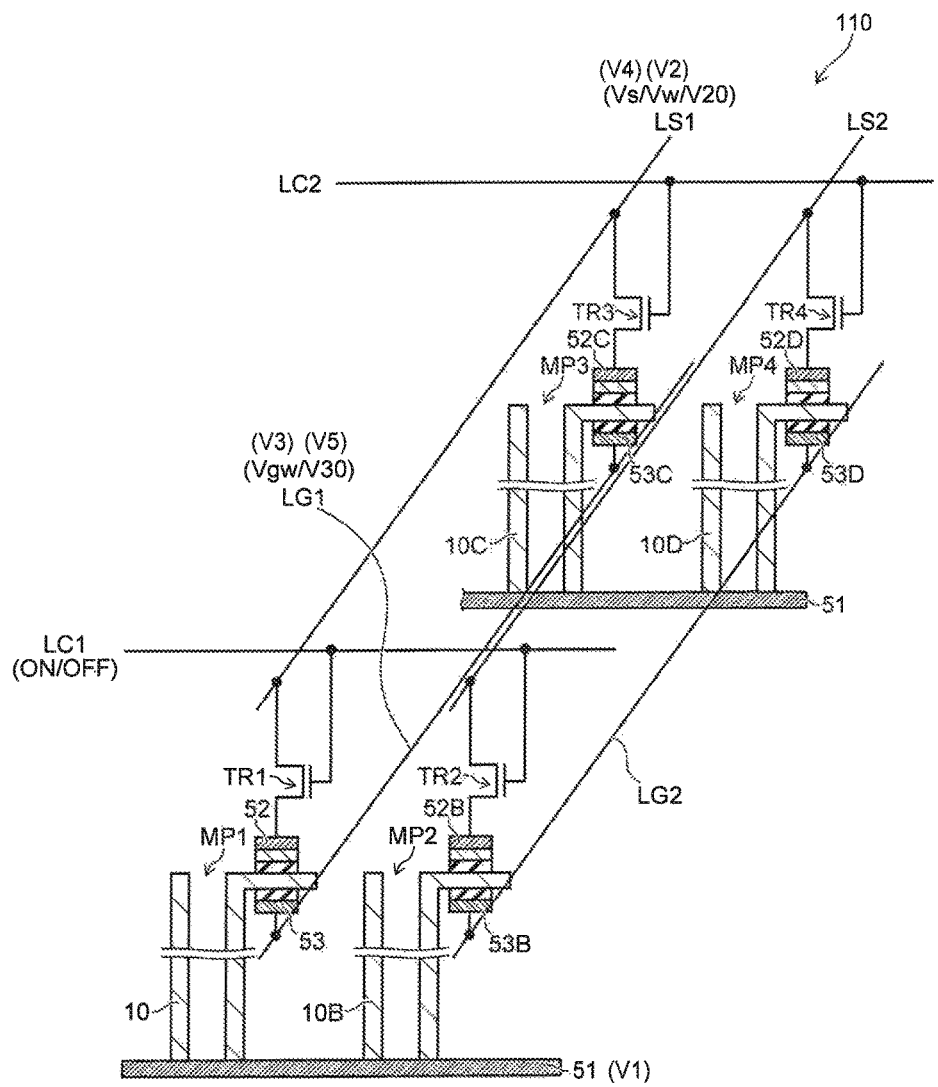
FIG. 3 is a schematic view illustrating an operation of the magnetic memory device according to the first embodiment.

FIG. 3 is a schematic view illustrating an operation of the magnetic memory device according to the first embodiment.

As shown in FIG. 3, the multiple memory portions (the first to fourth memory portions MP1 to MP4, etc.) are provided in the magnetic memory device 110. In FIG. 3, cross sections of the first to fourth memory portions MP1 to MP4 are illustrated. For example, the direction from the first memory portion MP1 toward the second memory portion MP2 is aligned with the X-axis direction. For example, the direction from the first memory portion MP1 toward the third memory portion MP3 is aligned with the Y-axis direction. For example, the direction from the second memory portion MP2 toward the fourth memory portion MP4 is aligned with the Y-axis direction.

A switch is provided in each of the multiple memory portions. A first switch TR1 is provided in the first memory portion MP1. A second switch TR2 is provided in the second memory portion MP2. A third switch TR3 is provided in the third memory portion MP3. A fourth switch TR4 is provided in the fourth memory portion MP4.

One end of the first switch TR1 is electrically connected to the second electrode 52. One end of the second switch TR2 is electrically connected to the electrode 52B. One end of the third switch TR3 is electrically connected to the electrode 52C. One end of the fourth switch TR4 is electrically connected to the electrode 52D.

For example, multiple cell selection lines (a first cell selection line LC1, a second cell selection line LC2, etc.) are provided. For example, the multiple cell selection lines extend along the X-axis direction.

For example, multiple read/write shift lines (a first read/write shift line LS1, a second read/write shift line LS2, etc.) are provided. For example, the multiple read/write shift lines extend along the Y-axis direction.

For example, multiple control lines (a first control line LG1, a second control line LG2, etc.) are provided. For example, the multiple control lines extend along the Y-axis direction.

Another end of the first switch TR1 is electrically connected to the first read/write shift line LS1. The gate of the first switch TR1 is electrically connected to the first cell selection line LC1.

Another end of the second switch TR2 is electrically connected to the second read/write shift line LS2. The gate of the second switch TR2 is electrically connected to the first cell selection line LC1.

Another end of the third switch TR3 is electrically connected to the first read/write shift line LS1. The gate of the third switch TR3 is electrically connected to the second cell selection line LC2.

Another end of the fourth switch TR4 is electrically connected to the second read/write shift line LS2. The gate of the fourth switch TR4 is electrically connected to the second cell selection line LC2.

The third electrode 53 and the electrode 53C are electrically connected to the first control line LG1. The electrode 53B and the electrode 53D are electrically connected to the second control line LG2.

The first electrode 51 functions as a common electrode. For example, the first electrode 51 is set to a first potential V1. The first potential V1 is, for example, a reference potential. The first potential V1 may be, for example, a ground potential.

The multiple cell selection lines (the first cell selection line LC1, the second cell selection line LC2, etc.) are set to a potential (a binary voltage) corresponding to "ON" or "OFF."

The multiple read/write shift lines (the first read/write shift line LS1, the second read/write shift line LS2, etc.) are set to a shift potential Vs, a writing potential Vw, or an OFF potential V20. The shift potential Vs corresponds to the voltage applied in the shift operation. The writing potential Vw corresponds to the voltage applied in the write operation. The OFF potential V20 is the potential when the operation is in the OFF state (e.g., the rest state). For example, the OFF potential V20 is the same as the first potential V1.

The multiple control lines (the first control line LG1, the second control line LG2, etc.) are set to, for example, a recording potential Vgw or a non-recording potential V30. The recording potential Vgw corresponds to the voltage applied when recording (writing). The non-recording potential V30 corresponds to the voltage applied when non-recording. As described below, the shift operation is performed when the non-recording potential V30 is set. Or, an operation is not performed when the non-recording potential V30 is set. For example, the non-recording potential V30 is the same as the first potential V1.

The first magnetic portion 10 has the following three characteristic voltage values. A first magnetic portion voltage Va is the voltage (the potential difference) necessary for shifting the magnetic domains 10d included in the first magnetic portion 10. A second magnetic portion voltage Vb is the voltage (the potential difference) necessary for writing to (reversing the magnetization of) the third portion 13 when the third electrode 53 is set to the non-recording potential V30. A third magnetic portion voltage Vc is the voltage (the potential difference) necessary for writing to (reversing the magnetization of) the third portion 13 when the third electrode 53 is set to the recording potential Vgw. For example, the three values recited above are dependent on the material, the structure, etc., of the first magnetic portion 10.

For example, the relationship is set to |Vb|>|Vs|>|Va|>|Vw|>|Vc|. Thereby, the write operation and the read operation are performed. On the other hand, the absolute value of the recording potential Vgw is greater than the absolute value of the non-recording potential V30.

For example, in a first operation of writing information to the third portion 13, the controller 70 sets the first electrode 51 to the first potential V1, sets the second electrode 52 to a second potential V2, and sets the third electrode 53 to a third potential V3. The second potential V2 is the writing potential Vw. The third potential V3 is the recording potential Vgw.

For example, in a second operation of shifting the information of the extension portion 10E, the controller 70 sets the first electrode 51 to the first potential V1, sets the second electrode 52 to a fourth potential V4, and sets the third electrode 53 to a fifth potential V5. The fourth potential V4 is the shift potential Vs. The fifth potential V5 is the non-recording potential V30.

As recited above, the absolute value of the shift potential Vs (the fourth potential V4) is greater than the absolute value of the writing potential Vw (the second potential V2). Accordingly, the absolute value of the difference between the fourth potential V4 and the first potential V1 is greater than the absolute value of the difference between the second potential V2 and the first potential V1.

On the other hand, the absolute value of the difference between the third potential V3 (the recording potential Vgw) and the first potential V1 is greater than the absolute value of the difference between the fifth potential V5 (the non-recording potential V30) and the first potential V1.

In one example, the third potential V3 (the recording potential Vgw) is lower than the second potential V2 (the writing potential Vw) in absolute value. For example, the absolute value of the difference between the third potential V3 and the first potential V1 is less than the absolute value of the difference between the second potential V2 and the first potential V1.

In one example, the third potential V3 (the recording potential Vgw) is lower than the third magnetic portion voltage Vc.

In FIG. 3, when the first cell selection line LC1 is set to "ON;" the first read/write shift line LS1 is set to the writing potential Vw; and the first control line LG1 is set to the recording potential Vgw. The first memory portion MP1 is selected; and the information is written to the first memory portion MP1.

In FIG. 3, when the first cell selection line LC1 is set to "ON;" the first read/write shift line LS1 is set to the shift potential Vs; and the first control line LG1 is set to the non-recording potential V30. The first memory portion MP1 is selected; and the shift operation of the first memory portion MP1 is performed. The information that is written and retained in the first magnetic portion 10 is shifted through the first magnetic portion 10. For example, the orientation of the shift is toward the first electrode 51. Thus, the shift operation is performed.

On the other hand, in the second memory portion MP2, the write operation is not performed and the shift operation is not performed because the second read/write shift line LS2 is "OFF." Likewise, these operations are not performed for the third memory portion MP3 and the fourth memory portion MP4.

Figure 4:
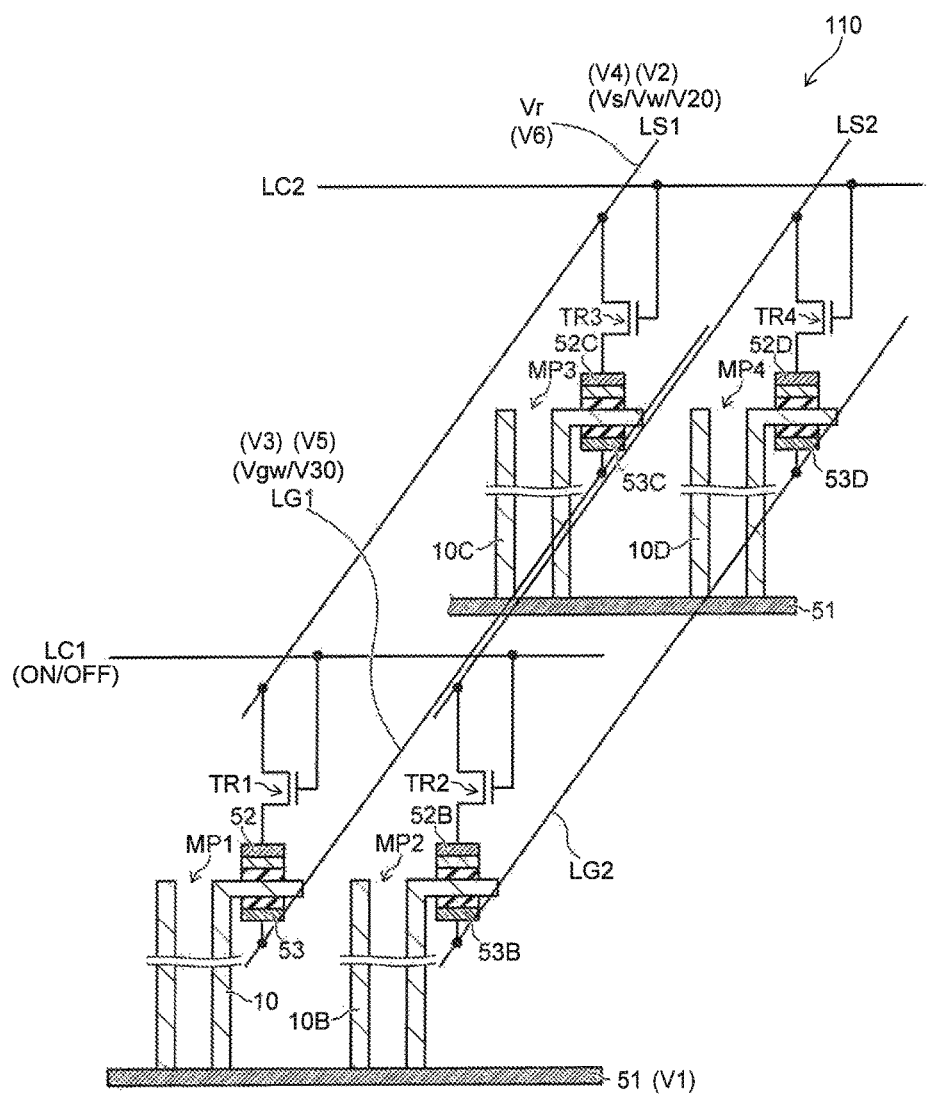
FIG. 4 is a schematic view illustrating an operation of the magnetic memory device according to the first embodiment.

FIG. 4 is a schematic view illustrating an operation of the magnetic memory device according to the first embodiment.

FIG. 4 corresponds to the read operation. As shown in FIG. 4, for example, when reading the information of the first memory portion MP1, the first cell selection line LC1 is set to "ON;" and the first read/write shift line LS1 is set to "ON" by applying a voltage Vr. Thereby, the first memory portion MP1 is selected. In this state, the voltage Vr is applied between the first read/write shift line LS1 and the first electrode 51. The voltage Vr may be, for example, the writing potential Vw. The voltage applied to the third electrode 53 during the reading operation is the non-recording potential V30, for example. A value (the electrical resistance, the voltage, the current, etc.) that corresponds to the electrical resistance between the first read/write shift line LS1 and the first electrode 51 is sensed using the voltage Vr (the writing potential Vw). The value that corresponds to the electrical resistance between the first read/write shift line LS1 and the first electrode 51 changes according to the information (the orientation of the magnetization) of the third portion 13. This is based on the magnetoresistance effect of the functional portion 25.

For example, in a third operation (the read operation), the controller 70 senses the value corresponding to the electrical resistance between the first electrode 51 and the second electrode 52. In the third operation, for example, the controller 70 sets the first electrode 51 to the first potential V1 and sets the second electrode 52 to a sixth potential V6. For example, the sixth potential V6 is the voltage Vr (the writing potential Vw) recited above. For example, the sixth potential V6 is lower than the first magnetic portion voltage Va recited above. For example, the sixth potential V6 is lower than the shift potential Vs. The sixth potential V6 may be lower than the writing potential Vw.

For example, the setting of the voltages (the potentials) recited above is performed by the controller 70.

Examples of other magnetic memory devices according to the embodiment will now be described. Portions different from those of the magnetic memory device 110 will now be described.

Figure 5:
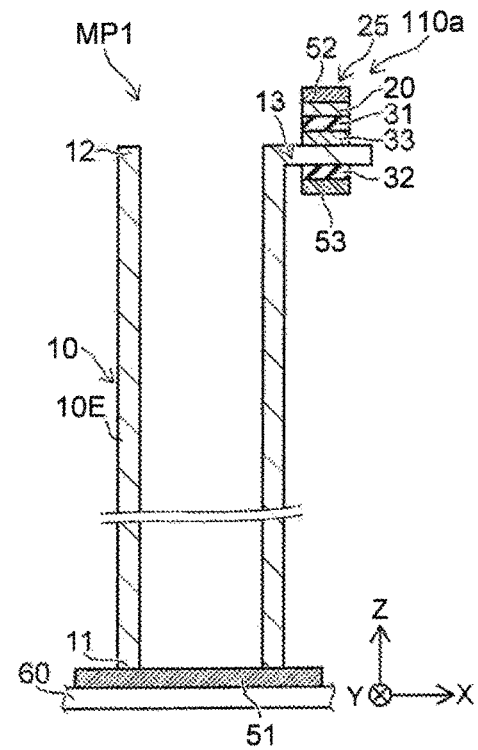
FIG. 5 is a schematic cross-sectional view illustrating another magnetic memory device according to the first embodiment.

FIG. 5 is a schematic cross-sectional view illustrating another magnetic memory device according to the first embodiment.

In the magnetic memory device 110a as shown in FIG. 5, a magnetic layer 33 is provided in the first memory portion MP1. The magnetic layer 33 is provided between the first nonmagnetic portion 31 and the third portion 13. The magnetic layer 33 may include a material similar to the first magnetic portion 10.

Figure 6:
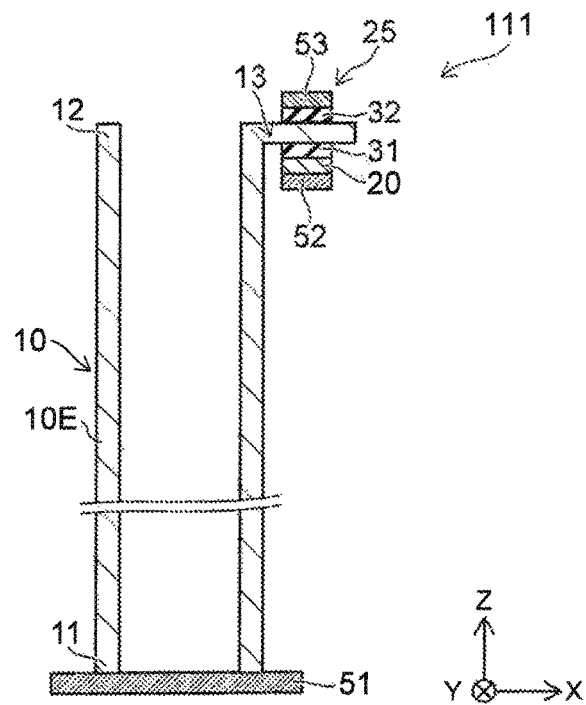
FIG. 6 is a schematic cross-sectional view illustrating another magnetic memory device according to the first embodiment.

FIG. 6 is a schematic cross-sectional view illustrating another magnetic memory device according to the first embodiment.

In the magnetic memory device 111 as shown in FIG. 6, the second electrode 52, instead of the third electrode 53, overlaps the extension portion 10E in the second direction. The second direction is a direction crossing the Z-axis direction and is the X-axis direction in the example.

Figure 7A:
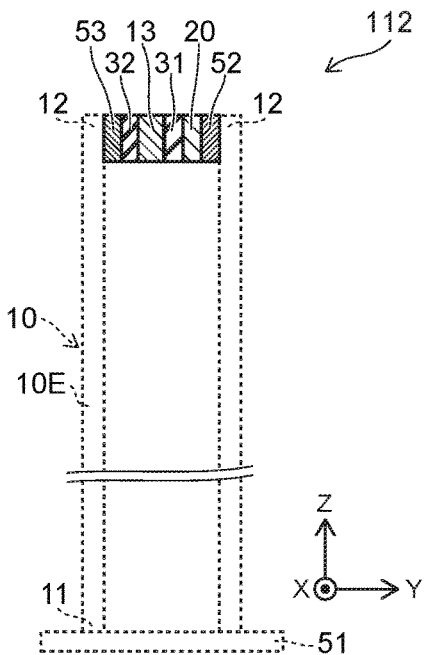
FIG. 7 is a schematic cross-sectional view illustrating another magnetic memory device according to the first embodiment.
Figure 7B:
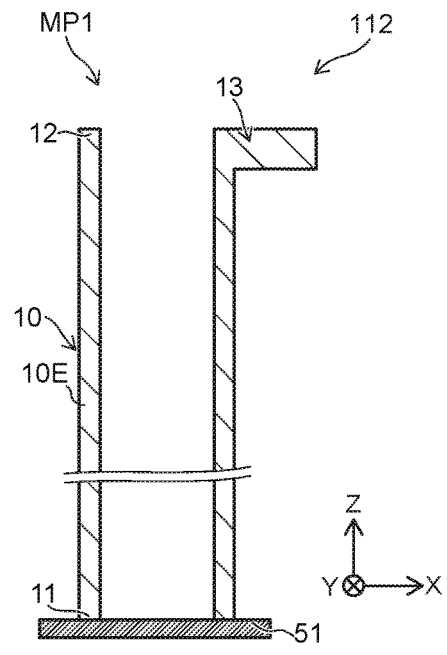

FIG. 7 is a schematic cross-sectional view illustrating another magnetic memory device according to the first embodiment.

In the magnetic memory device 112 as shown in FIG. 7, the direction from the third electrode 53 toward the second electrode 52 is aligned with the Y-axis direction. For example, the direction from the third electrode 53 toward the second electrode 52 crosses a plane (the Z-X plane) including the first direction (the Z-axis direction) and the second direction (e.g., the X-axis direction).

Figure 8A:
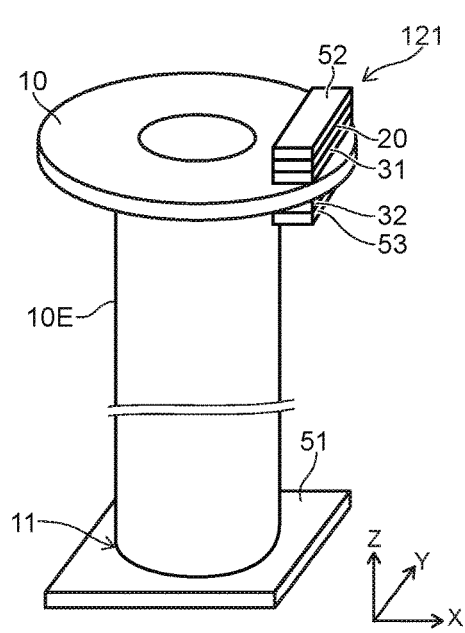
FIG. 8A and FIG. 8B are schematic cross-sectional views illustrating another magnetic memory device according to the first embodiment.
Figure 8B:
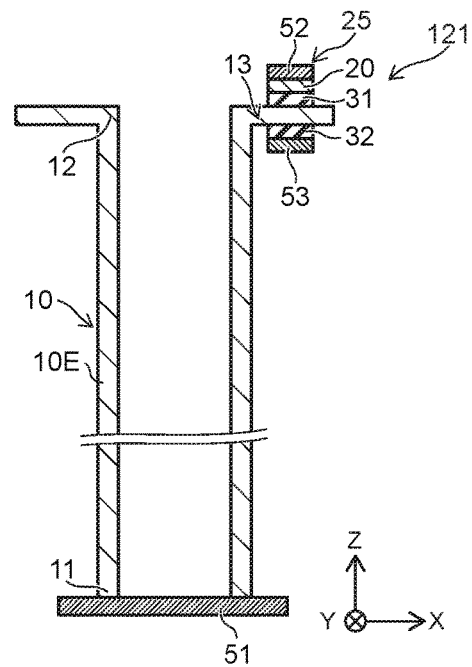

FIG. 8A and FIG. 8B are schematic cross-sectional views illustrating another magnetic memory device according to the first embodiment.

In the magnetic memory device 121 as shown in FIG. 8A and FIG. 8B, the third portion 13 is provided around the second portion 12. The second direction from the third portion 13 toward the second portion 12 crosses the first direction (the Z-axis direction). The second direction is a radial direction crossing the Z-axis direction. The third portion 13 has a ring configuration.

Figure 9:
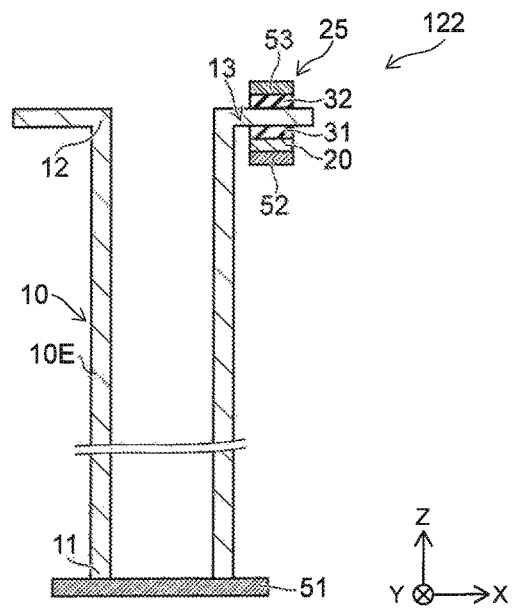
FIG. 9 is a schematic cross-sectional view illustrating another magnetic memory device according to the first embodiment.

FIG. 9 is a schematic cross-sectional view illustrating another magnetic memory device according to the first embodiment.

As shown in FIG. 9, in the magnetic memory device 122 as well, the third portion 13 is provided around the second portion 12. The second direction from the third portion 13 toward the second portion 12 crosses the first direction (the Z-axis direction).

Figures 10A, 10B:
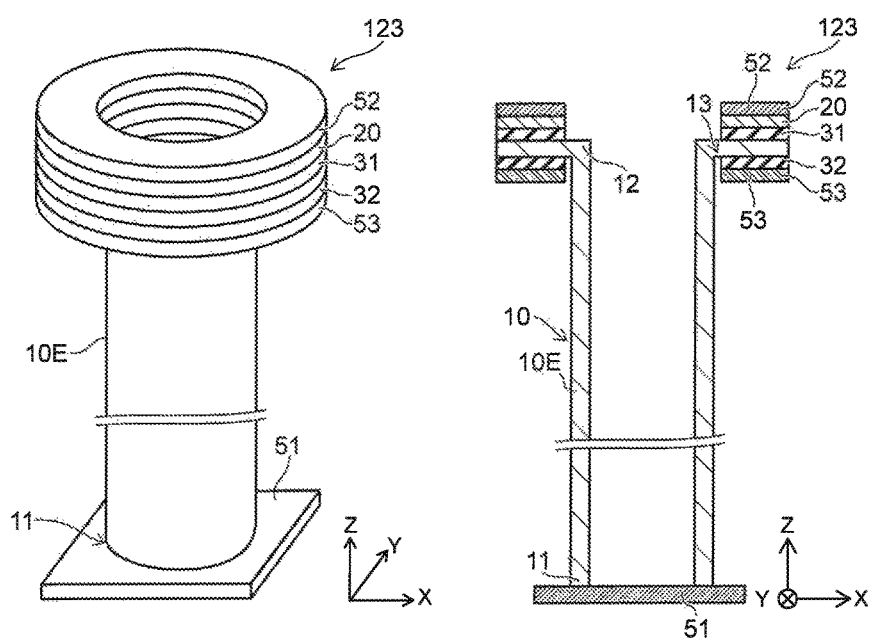
FIG. 10A and FIG. 10B are schematic cross-sectional views illustrating another magnetic memory device according to the first embodiment.

FIG. 10A and FIG. 10B are schematic cross-sectional views illustrating another magnetic memory device according to the first embodiment.

As shown in FIG. 10A and FIG. 10B, in the magnetic memory device 123 as well, the second electrode 52 has a ring configuration. The third electrode 53 also has a ring configuration. In the example, the third electrode 53 is provided around the extension portion 10E. The third electrode 53 overlaps the extension portion 10E in the second direction from the third portion 13 toward the second portion 12.

Figure 11:
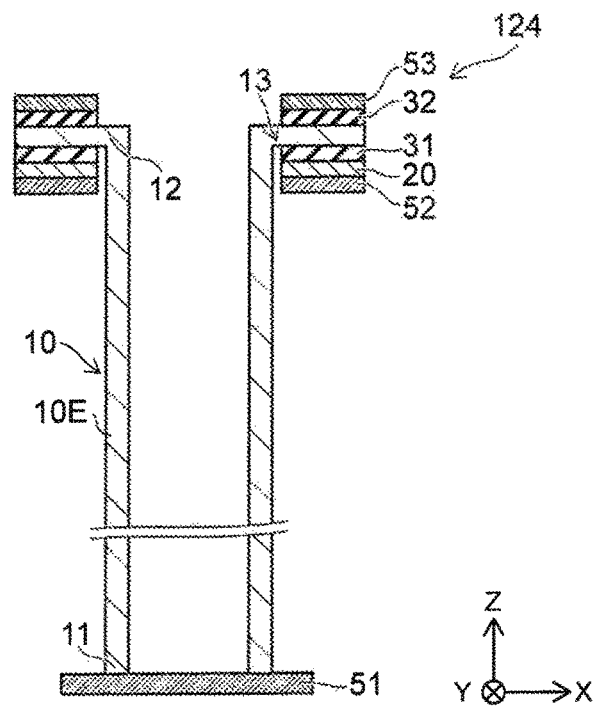
FIG. 11 is a schematic cross-sectional view illustrating another magnetic memory device according to the first embodiment.
Figure 12:
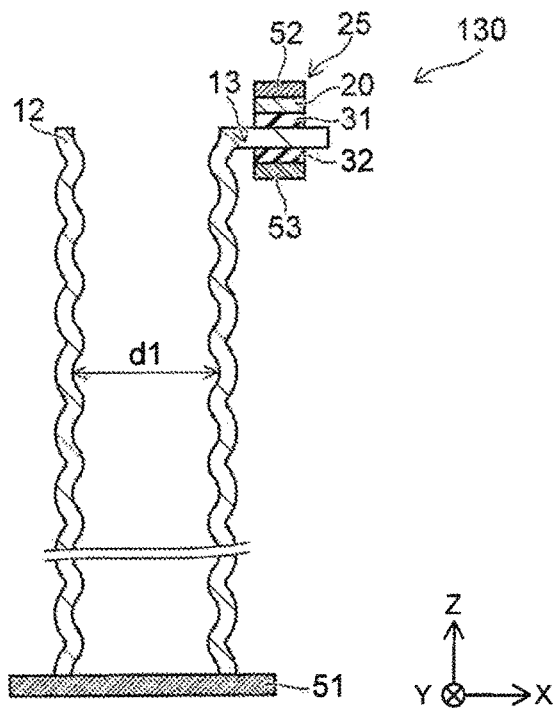
FIG. 12 is a schematic cross-sectional view illustrating another magnetic memory device according to the first embodiment.
Figure 13:
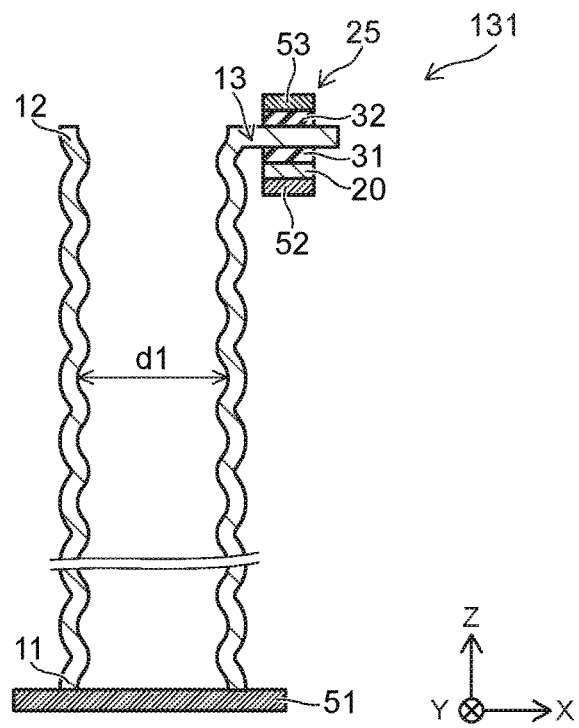
FIG. 13 is a schematic cross-sectional view illustrating another magnetic memory device according to the first embodiment.
Figure 14A:
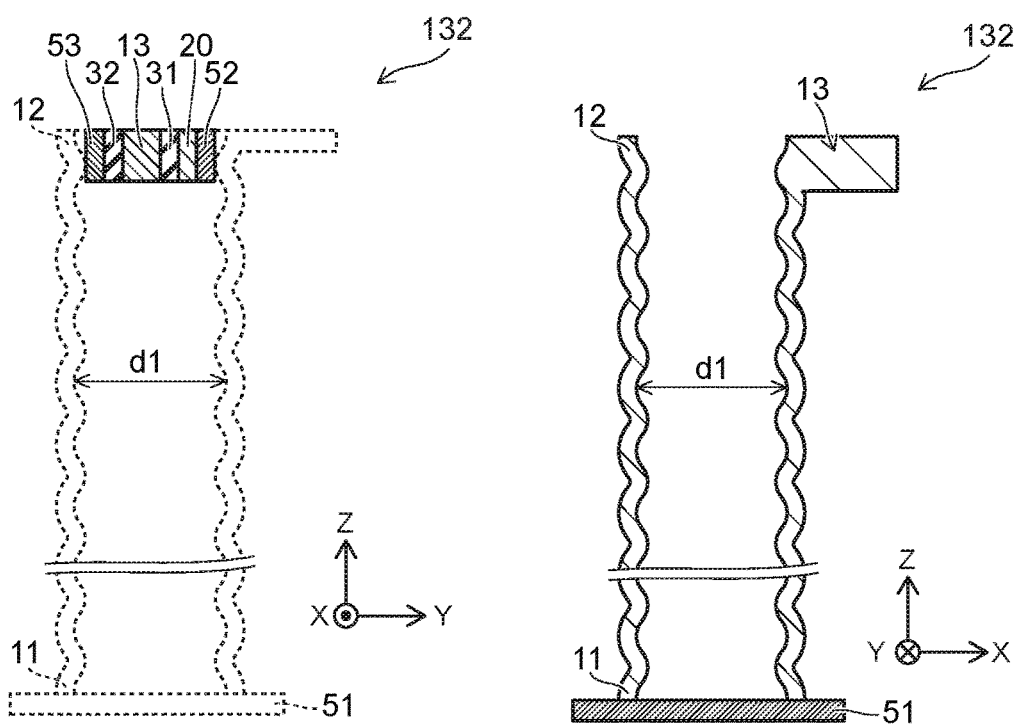
FIG. 14 is a schematic cross-sectional view illustrating another magnetic memory device according to the first embodiment.
Figure 15:
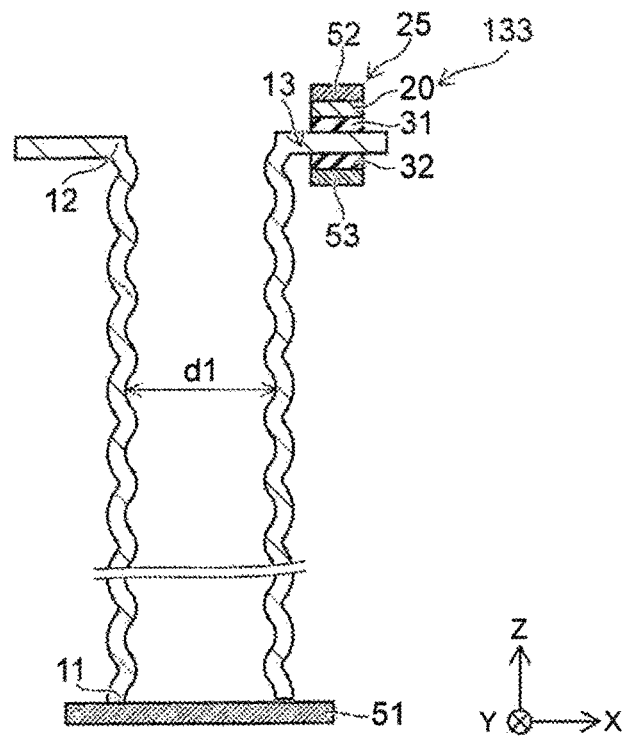
FIG. 15 is a schematic cross-sectional view illustrating another magnetic memory device according to the first embodiment.
Figure 16:
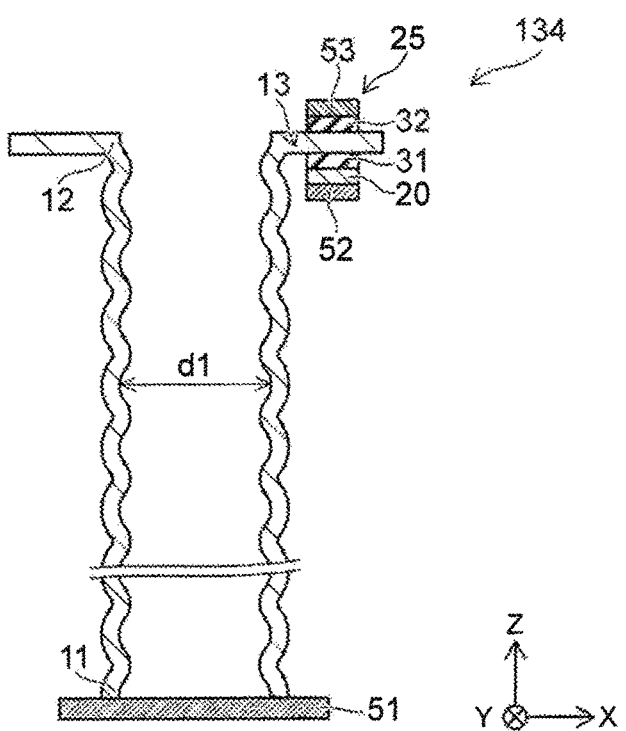
FIG. 16 is a schematic cross-sectional view illustrating another magnetic memory device according to the first embodiment.
Figure 17:
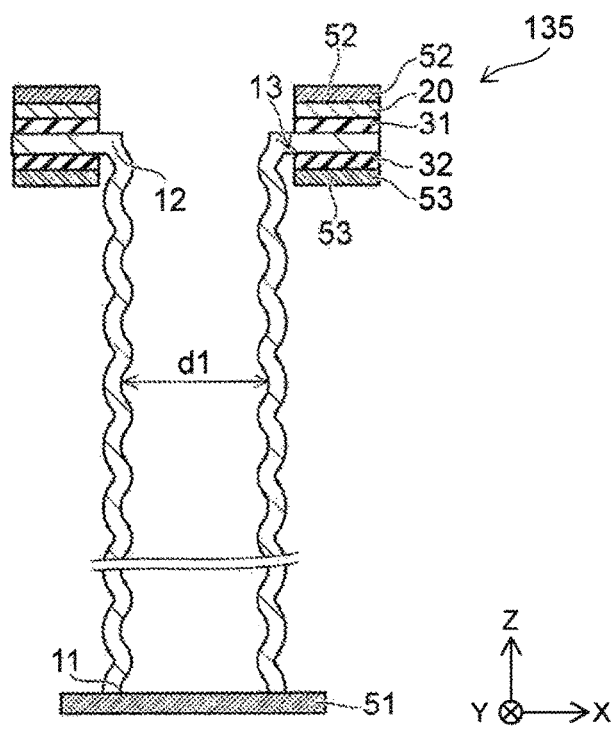
FIG. 17 is a schematic cross-sectional view illustrating another magnetic memory device according to the first embodiment.
Figure 18:
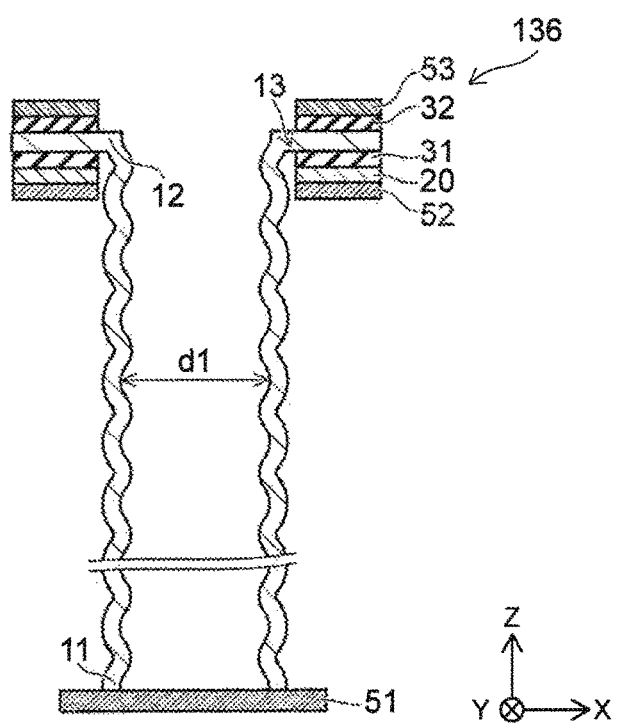
FIG. 18 is a schematic cross-sectional view illustrating another magnetic memory device according to the first embodiment.

FIG. 11 is a schematic cross-sectional view illustrating another magnetic memory device according to the first embodiment.

As shown in FIG. 11, in the magnetic memory device 124 as well, the second electrode 52 has a ring configuration. The third electrode 53 also has a ring configuration. In the example, the second electrode 52 is provided around the extension portion 10E. The second electrode 52 overlaps the extension portion 10E in the second direction from the third portion 13 toward the second portion 12.

FIG. 12 to FIG. 18 are schematic cross-sectional views illustrating other magnetic memory devices according to the first embodiment.

In the magnetic memory devices 130 to 136 as shown in FIG. 12 to FIG. 18, an increase and decrease of a diameter d1 of the extension portion 10E is repeated in the first direction (the Z-axis direction). The diameter d1 is the length (the width) of the extension portion 10E in a direction crossing the first direction (the Z-axis direction). Thus, for example, the controllability of the position of the magnetization of the extension portion 10E is improved by repeating the increase and decrease in the first direction of the width d1 of the extension portion 10E in the direction crossing the first direction.

Figure 19:
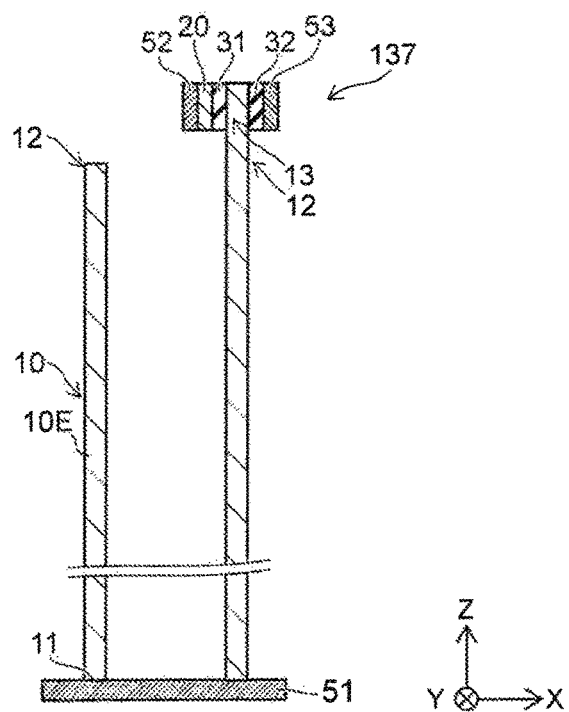
FIG. 19 is a schematic cross-sectional view illustrating another magnetic memory device according to the first embodiment.

FIG. 19 is a schematic cross-sectional view illustrating another magnetic memory device according to the first embodiment.

In the magnetic memory device 137 as shown in FIG. 19, the direction from the at least a portion of the third portion 13 recited above toward the second portion 12 is aligned with the first direction (the Z-axis direction). In such a case, the direction from the third electrode 53 toward the second electrode 52 crosses the first direction (the Z-axis direction).

In the magnetic memory devices 111, 112, 121 to 124, and 130 to 137 as well, the storage density can be increased.

Second Embodiment

Figure 20:
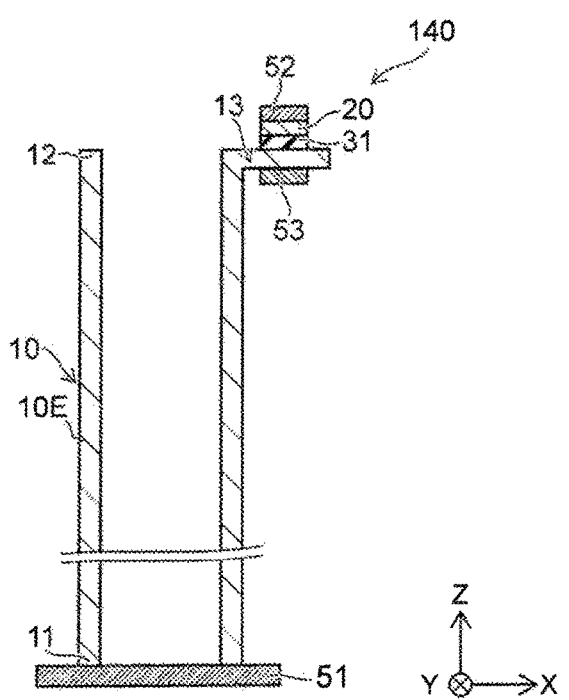
FIG. 20 is a schematic cross-sectional view illustrating a magnetic memory device according to a second embodiment.

FIG. 20 is a schematic cross-sectional view illustrating a magnetic memory device according to a second embodiment.

In the magnetic memory device 140 as shown in FIG. 20, the third electrode 53 contacts the third portion 13. The portion of the third electrode 53 corresponding to the third portion 13 includes, for example, Pt, etc. A magnetic property (e.g., the magnetic anisotropy) of the third portion 13 is changed by a pulse applied to the third electrode 53. The operation can be controlled by the voltage pulse applied to the third electrode 53.

Examples of materials of the embodiment will now be described.

The first magnetic portion 10 includes, for example, a perpendicular magnetization film.

The first magnetic portion 10 may include, for example, a rare earth-transition metal amorphous alloy. The rare earth-transition metal amorphous alloy includes, for example, an alloy including a rare earth-transition metal and a 3d transition metal. The rare earth-transition metal amorphous alloy is, for example, a ferrimagnet. The rare earth-transition metal amorphous alloy includes, for example, at least one transition metal and at least one selected from the group consisting of Tb (terbium), Dy (dysprosium), and Gd (gadolinium). The rare earth-transition metal amorphous alloy includes, for example, at least one selected from the group consisting of TbFe, TbCo, TbFeCo, DyTbFeCo, GdTbCo, and GdFeCo.

The first magnetic portion 10 may include, for example, a multilayer film. The first magnetic portion 10 includes, for example, at least one selected from the group consisting of a multilayer film including a Co film and a Ni film, a multilayer film including a Co film and a Pd film, and a multilayer film including a Co film and a Pt film.

The first magnetic portion 10 may include, for example, an ordered alloy. The ordered alloy includes, for example, at least one selected from the group consisting of Fe, Co, and Ni, and at least one selected from the group consisting of Pt and Pd. The crystal structure of the ordered alloy is, for example, the $L_{10}$-type. The ordered alloy may include, for example, at least one selected from the group consisting of $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. The composition ratio of the ordered alloy is not limited to that recited above.

The first magnetic portion 10 may include an ordered alloy and another element. The other element includes, for example, at least one selected from the group consisting of V, Mn, Cu, Cr, and Ag. By adding these elements, for example, the magnetic anisotropy energy or the saturation magnetization may be adjusted. For example, a large magnetic anisotropy energy is obtained.

The second magnetic portion 20 includes, for example, at least one selected from the group consisting of Fe, Co, and Ni. The second magnetic portion 20 may include, for example, an alloy including at least one selected from the group consisting of Fe, Co, and Ni. The second magnetic portion 20 may further include, for example, another element (e.g., a semimetal). The other element includes, for example, at least one selected from the group consisting of boron and silicon. The second magnetic portion 20 may include, for example, a multilayer film. The multilayer film includes a first film and a second film. The first film includes, for example, at least one selected from the group consisting of Fe, Co, and Ni. The second film includes a platinum group metal (e.g., Pt, Pd, etc.). The second magnetic portion 20 includes, for example, a multilayer film including a Ni film and a film of a Co—Fe alloy (a Co—Fe/Ni multilayer film).

At least one of the first electrode 51, the second electrode 52, or the third electrode 53 includes, for example, at least one selected from the group consisting of Cu, Ag, Au, and Al. At least one of these electrodes may include an alloy including at least one of these elements.

The first nonmagnetic portion 31 includes, for example, at least one selected from the group consisting of aluminum oxide ($AlO_x$), aluminum nitride (AlN), magnesium oxide (MgO), magnesium nitride, silicon oxide ($SiO_2$), silicon nitride (Si—N), silicon oxynitride (Si—O—N), titanium oxide ($TiO_2$), and chromium oxide ($Cr_2O_3$). These materials function as, for example, a nonmagnetic tunneling barrier. The first nonmagnetic portion 31 may include, for example, a nonmagnetic metal. For example, the spin torque is transferred effectively by the appropriate material (and thickness) of the first nonmagnetic portion 31.

The second nonmagnetic portion 32 includes, for example, at least one selected from the group consisting of a metal oxide, a metal nitride, and a metal oxynitride. The second nonmagnetic portion 32 includes, for example, at least one selected from the group consisting of aluminum oxide ($AlO_x$), aluminum nitride (AlN), magnesium oxide (MgO), magnesium nitride, silicon oxide ($SiO_2$), silicon nitride (Si—N), silicon oxynitride (Si—O—N), titanium oxide ($TiO_2$), and chromium oxide ($Cr_2O_3$). The second nonmagnetic portion 32 includes, for example, at least one selected from the group consisting of barium titanate ($BaTiO_3$), $SrTiO_3$, $PbTiO_3$, and $HfO_2$. The second nonmagnetic portion 32 includes, for example, an insulating material (a dielectric). For example, the thickness of the second nonmagnetic portion 32 is thicker than the thickness of the first nonmagnetic portion 31. The thickness is the length in the direction from the third electrode 53 toward the second electrode 52.

The embodiments may include the following configurations (e.g., technological proposals).

Configuration 1

A magnetic memory device, comprising:
a first magnetic portion including an extension portion and a third portion, the extension portion including a first portion and a second portion, the third portion being connected to the second portion, a direction from the first portion toward the second portion being aligned with a first direction;
a first electrode electrically connected to the first portion;
a second electrode;
a third electrode, at least a portion of the third portion being positioned between the second electrode and the third electrode;
a second magnetic portion provided between the second electrode and the at least a portion of the third portion;
a first nonmagnetic portion provided between the second magnetic portion and the at least a portion of the third portion; and
a controller electrically connected to the first electrode, the second electrode, and the third electrode,
in a first operation of writing information to the third portion, the controller setting the first electrode to a first potential, setting the second electrode to a second potential, and setting the third electrode to a third potential,
in a second operation of shifting information of the extension portion, the controller setting the first electrode to the first potential, setting the second electrode to a fourth potential, and setting the third electrode to a fifth potential,
an absolute value of a difference between the second potential and the first potential being less than an absolute value of a difference between the fourth potential and the first potential,
an absolute value of a difference between the third potential and the first potential being greater than an absolute value of a difference between the fifth potential and the first potential.

Configuration 2

The magnetic memory device according to Configuration 1, wherein the absolute value of the difference between the third potential and the first potential is less than the absolute value of the difference between the second potential and the first potential.

Configuration 3

The magnetic memory device according to Configuration 1 or 2, wherein the controller in a third operation senses a value corresponding to an electrical resistance between the first electrode and the second electrode.

Configuration 4

The magnetic memory device according to Configuration 3, wherein the controller in the third operation sets the first electrode to the first potential and sets the second electrode to a sixth potential.

Configuration 5

The magnetic memory device according to any one of Configurations 1 to 4, further comprising a second nonmagnetic portion provided between the third electrode and the at least a portion of the third portion, the second nonmagnetic portion being insulative.

Configuration 6

The magnetic memory device according to any one of Configurations 1 to 5, wherein a second direction from the at least a portion of the third portion toward the second portion crosses the first direction.

Configuration 7

The magnetic memory device according to any one of Configurations 1 to 5, wherein
the third portion is provided around the second portion, and
a second direction from the third portion toward the second portion crosses the first direction.

Configuration 8

The magnetic memory device according to Configuration 7, wherein the third electrode is provided around the extension portion.

Configuration 9

The magnetic memory device according to Configuration 8, wherein the second electrode has a ring configuration.

Configuration 10

The magnetic memory device according to Configuration 7, wherein the second electrode is provided around the extension portion.

Configuration 11

The magnetic memory device according to Configuration 10, wherein the third electrode has a ring configuration.

Configuration 12

The magnetic memory device according to any one of Configurations 6 to 11, wherein a direction from the third electrode toward the second electrode is aligned with the first direction.

Configuration 13

The magnetic memory device according to Configuration 12, wherein the third electrode overlaps the extension portion in the second direction.

Configuration 14

The magnetic memory device according to Configuration 12, wherein the second electrode overlaps the extension portion in the second direction.

Configuration 15

The magnetic memory device according to Configuration 6, wherein a direction from the third electrode toward the second electrode crosses a plane including the first direction and the second direction.

Configuration 16

The magnetic memory device according to any one of Configurations 1 to 15, wherein the extension portion has a pipe configuration extending in the first direction.

Configuration 17

The magnetic memory device according to Configuration 16, wherein an increase and decrease of a diameter of the extension portion is repeated in the first direction, the diameter being in a direction crossing the first direction.

Configuration 18

The magnetic memory device according to any one of Configurations 1 to 16, wherein an increase and decrease of a width of the extension portion is repeated in the first direction, the width being in a direction crossing the first direction.

Configuration 19

The magnetic memory device according to any one of Configurations 1 to 18, wherein the extension portion is configured to retain multiple domain walls.

Configuration 20

The magnetic memory device according to any one of Configurations 1 to 19, wherein the first magnetic portion is multiply provided, and the multiple first magnetic portions are provided along two directions crossing the first direction.

According to the embodiments, a magnetic memory device can be provided in which the storage density can be increased.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory device such as the magnetic portion, the nonmagnetic portion, the electrode, the controller, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All magnetic memory devices practicable by an appropriate design modification by one skilled in the art based on the magnetic memory devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a first magnetic portion including an extension portion and a third portion, the extension portion including a first portion and a second portion, the third portion being connected to the second portion, a direction from the first portion toward the second portion being aligned with a first direction;
   a first electrode electrically connected to the first portion;
   a second electrode;
   a third electrode, at least a portion of the third portion being positioned between the second electrode and the third electrode;
   a second magnetic portion provided between the second electrode and the at least a portion of the third portion;
   a first nonmagnetic portion provided between the second magnetic portion and the at least a portion of the third portion; and
   a controller electrically connected to the first electrode, the second electrode, and the third electrode,
   in a first operation of writing information to the third portion, the controller setting the first electrode to a first potential, setting the second electrode to a second potential, and setting the third electrode to a third potential,
   in a second operation of shifting magnetic domains of the extension portion, the controller setting the first electrode to the first potential, setting the second electrode to a fourth potential, and setting the third electrode to a fifth potential,
   an absolute value of a difference between the second potential and the first potential being less than an absolute value of a difference between the fourth potential and the first potential,
   an absolute value of a difference between the third potential and the first potential being greater than an absolute value of a difference between the fifth potential and the first potential.

2. The device according to claim 1, wherein the absolute value of the difference between the third potential and the first potential is less than the absolute value of the difference between the second potential and the first potential.

3. The device according to claim 1, wherein the controller in a third operation senses a value corresponding to an electrical resistance between the first electrode and the second electrode.

4. The device according to claim 3, wherein the controller in the third operation sets the first electrode to the first potential and sets the second electrode to a sixth potential.

5. The device according to claim 1, further comprising a second nonmagnetic portion provided between the third electrode and the at least a portion of the third portion, the second nonmagnetic portion being insulative.

6. The device according to claim 1, wherein a second direction from the at least a portion of the third portion toward the second portion crosses the first direction.

7. The device according to claim 1, wherein
the third portion is provided around the second portion, and
a second direction from the third portion toward the second portion crosses the first direction.

8. The device according to claim 7, wherein the third electrode is provided around the extension portion.

9. The device according to claim 8, wherein the second electrode has a ring configuration.

10. The device according to claim 7, wherein the second electrode is provided around the extension portion.

11. The device according to claim 10, wherein the third electrode has a ring configuration.

12. The device according to claim 6, wherein a direction from the third electrode toward the second electrode is aligned with the first direction.

13. The device according to claim 12, wherein the third electrode in the second direction overlaps the extension portion.

14. The device according to claim 12, wherein the second electrode overlaps the extension portion in the second direction.

15. The device according to claim 6, wherein a direction from the third electrode toward the second electrode crosses a plane including the first direction and the second direction.

16. The device according to claim 1, wherein the extension portion has a pipe configuration extending in the first direction.

17. The device according to claim 16, wherein an increase and decrease of a diameter of the extension portion is repeated in the first direction, the diameter being in a direction crossing the first direction.

18. The device according to claim 1, wherein an increase and decrease of a width of the extension portion is repeated in the first direction, the width being in a direction crossing the first direction.

19. The device according to claim 1, wherein the extension portion is configured to retain a plurality of domain walls.

20. The device according to claim 1, wherein
a plurality of the first magnetic portions is provided, and
the plurality of the first magnetic portions are provided along two directions crossing the first direction.

* * * * *